United States Patent [19]

Zambrano et al.

[11] Patent Number: 5,895,249
[45] Date of Patent: *Apr. 20, 1999

[54] INTEGRATED EDGE STRUCTURE FOR HIGH VOLTAGE SEMICONDUCTOR DEVICES AND RELATED MANUFACTURING PROCESS

[75] Inventors: Raffaele Zambrano, Giovanni La Punta; Salvatore Leonardi, Stazzo fraz-Acireale; Giovanna Cacciola, Messina, all of Italy

[73] Assignee: Consorzio per la Ricerca sulla Microelettronica nel Mezzogiorno, Catania, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/604,110

[22] Filed: Feb. 20, 1996

Related U.S. Application Data

[62] Division of application No. 08/463,980, Jun. 5, 1995, abandoned, which is a division of application No. 08/265,059, Jun. 28, 1994, Pat. No. 5,489,799.

[30] Foreign Application Priority Data

Jul. 1, 1993 [EP] European Pat. Off. ............ 93/830286

[51] Int. Cl.⁶ .................................................. H01L 21/331
[52] U.S. Cl. ............................. 438/356; 438/309; 438/335; 438/357; 438/358
[58] Field of Search .................................. 437/27, 74, 75, 437/76, 77; 438/309, 335, 340, 356, 357, 358

[56] References Cited

FOREIGN PATENT DOCUMENTS

| | | | |
|---|---|---|---|
| A-0 126 499 | 11/1986 | European Pat. Off. | ........ H01L 21/76 |
| 2-154428 | 6/1990 | Japan | ............ 257/565 |
| A-2 154 428 | 6/1990 | Japan | ............ 257/565 |
| A-2 163 597 | 2/1986 | United Kingdom | ............ H01L 29/06 |

OTHER PUBLICATIONS

European Search Report from European Patent Application Number 93830286.6, filed Jul. 1, 1993.
Patent Abstracts of Japan, vol. 6, No. 185 (E-132)(1063) Sep. 21, 1992 & JP-A57100744.

*Primary Examiner*—Trung Dang
*Attorney, Agent, or Firm*—Wolf, Greenfield & Sacks, P.C.

[57] ABSTRACT

An integrated edge structure for a high voltage semiconductor device comprising a PN junction represented by a diffused region of a first conductivity type extending from a semiconductor device top surface is described. The edge structure comprises a first, lightly doped ring of the first conductivity type obtained in a first, lightly doped epitaxial layer of a second conductivity type and surrounding said diffused region, and a second, lightly doped ring of the first conductivity type, comprising at least one portion superimposed on and merged with said first ring, obtained in a second, lightly doped epitaxial layer of the second conductivity type grown over the first epitaxial layer.

5 Claims, 3 Drawing Sheets

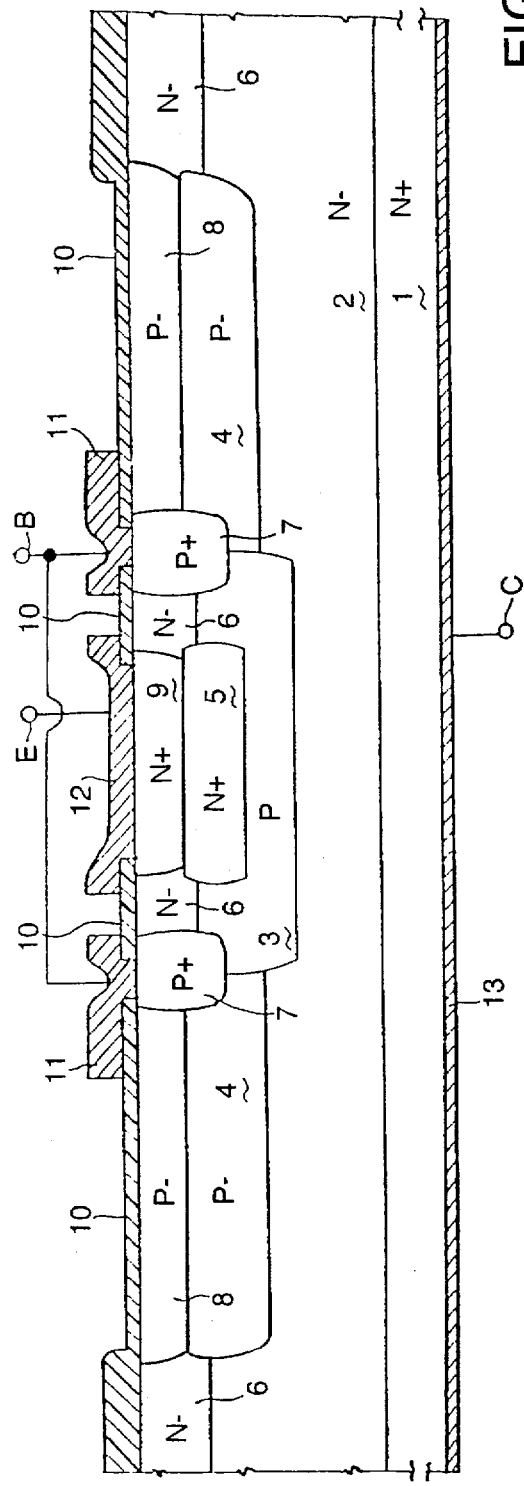

INTEGRATED EDGE STRUCTURE FOR HIGH VOLTAGE SEMICONDUCTOR DEVICES AND RELATED MANUFACTURING PROCESS

This application is a division of application Ser. No. 08/463,980, filed Jun. 5, 1995, entitled INTEGRATED EDGE STRUCTURE FOR HIGH VOLTAGE SEMICONDUCTOR DEVICES AND RELATED MANUFACTURING PROCESS now abandoned, which in turn is a division of application Ser. No. 08/265,059, filed Jun. 28, 1994, now U.S. Pat. No. 5,489,799.

BACKGROUND OF THE INVENTION

1. Field of the Invention

The present invention relates to an integraded edge structure for high voltage semiconductor devices and a related manufacturing process.

2. Discussion of Related Art

High voltage semiconductor devices include PN junctions which must withstand high reverse voltages, e.g., the base-collector junction of a bipolar NPN transistor. Most PN junctions, fabricated by planar technology, essentially consist of a first semiconductor region of a given conductivity type diffused into a second semiconductor region of opposite conductivity type. An insulating oxide layer is superimposed over the two regions, and metal contacts are provided for electrical connection of the two semiconductor regions A depletion region is associated with the PN junction, which can be considered as made up of two regions, a first one along the plane portion of the junction, a second one at the edges of the plane portion. The electric field has a different behavior in each of the two regions. In the plane portion, the equipotential lines are parallel to the junction; the maximum electric field is located at the junction; and breakdown occurs when the electric field critical value "Ecrit." At the junction edges, because of the finite junction depth, the equipotential lines are curved and closer than in the plane portion. Consequently, the electric field increases, because higher electric fields are associated with smaller curvature radii, i.e., shallower junctions.

The breakdown voltage of a PN diffused junction is usually lower than that of the corresponding plane junction, because the electric field in the edge region is much higher. Thus, the ratio of the breakdown voltage of the edge and the plane portion is below unity.

Several techniques have been developed to increase this ratio, essentially by changing the size of the depletion layer to avoid local increases in the electric field that can lead to early breakdown. In one of these techniques, the metal contact of the diffused region of the junction is extended over the insulating oxide layer. In this way, a metal field-plate is formed which, acting as a shield, causes the equipotential lines to extend over a wider region, thus reducing the electric field. The high density of the equipotential lines in the oxide layer does not represent a problem, because of the higher dielectric strength of the oxide layer with respect to the silicon. At the metal field-plate edge, however, the shielding action ceases, with an increase of the electric field in the surface region.

To reduce the surface electric field, the metal field-plate can be extended over a thicker region of the oxide layer. However, surface states, fixed interface charges, and mobile charges can lead to surface breakdown.

In another technique, described in GB-A-2163597, one or more high resistivity rings are provided around the lateral edges of the junction. In this way the depletion layer spreads over wider regions, so that the spatial charge distribution is widened and the electric field is consequently reduced. The rings are formed by implantation and diffusion of dopants. By controlling the implanted dose and the diffusion process, it is possible to achieve the desired resistivity. Two or more concentrical rings, with increasing resistivity from the inner to the outer one, are necessary when the device must withstand high reverse voltages. However, peaks in the electric field value are observed at the interface between the two rings and at the edge of the outer ring. An increase in the number of rings leads to larger spreading of the depletion layer, and the peaks in the electric field value are lowered.

The effectiveness of the high resistivity rings could be improved by increasing their depth. This reduces the electric field, especially pear the surface of the semiconductor device, where the existence of surface charges causes local variations of the electric field value.

To obtain a deep junction by implantation and diffusion, it is necessary to use dopants having high diffusivity, and the diffusion process must be extended in time and/or performed at higher temperatures. Both of these solutions are disadvantageous for an industrial application.

In view of the state of art described, an object of the present invention is to provide an integrated edge structure, for high voltage semiconductor devices, which has deep, high resistivity rings, but requires neither the use of high-diffusivity dopant species nor long, high-temperature diffusion processes.

SUMMARY OF THE INVENTION

According to the present invention, these and other objects are attained by an integrated edge structure for a high voltage monolithic semiconductor device comprising a PN junction having a diffused region of a first conductivity type extending from a semiconductor device top surface of the device and having a first, lightly doped ring of the first conductivity type obtained in a first, lightly doped epitaxial layer of a second conductivity type and surrounding the diffused region. The device further includes a second, lightly doped ring of the first conductivity type, comprising at least one portion superimposed on and merged with the first ring The second ring obtained in a second, lightly doped epitaxial layer of the second conductivity type placed over the first epitaxial layer.

According to the present invention, it is possible to obtain deep edge structures that cause the depletion layer to spread over regions sufficiently wide so as to decrease the electric field below the critical value. In addition, by being obtained in superimposed epitaxial layers, high-diffusivity dopants or long, high-termperature diffusion processes are unnecessary.

The present invention also includes a corresponding manufacturing process that may include the following steps:

a) growing a first, lightly doped epitaxial layer of a second conductivity type over a heavily doped semiconductor substrate;

b) maskedly implanting and subsequently diffusing dopants into the first epitaxial layer to form a first, lightly doped ring of the first conductivity type;

c) growing of a second, lightly doped epitaxial layer of the second conductivity type over the first epitaxial layer;

d) maskedly implanting and subsequently diffusing dopants into the second epitaxial layer to form a diffused region of the first conductivity type; and e) maskedly implanting and subsequently diffusing dopants into the second epitaxial layer to form a second, lightly doped ring of the first conductivity type comprising at least one portion superimposed over and merged with the first ring and surrounding the diffused region.

BRIEF DESCRIPTION OF THE DRAWINGS

The features of the present invention shall be made more evident by the following detailed description of some embodiments, illustrated as non-limiting examples in the annexed drawings, wherein:

FIG. 1 is a cross-sectional view of a first embodiment of the present invention;

FIG. 2 is a cross-sectional view of a second embodiment of the invention;

DETAILED DESCRIPTION

Figure 3:
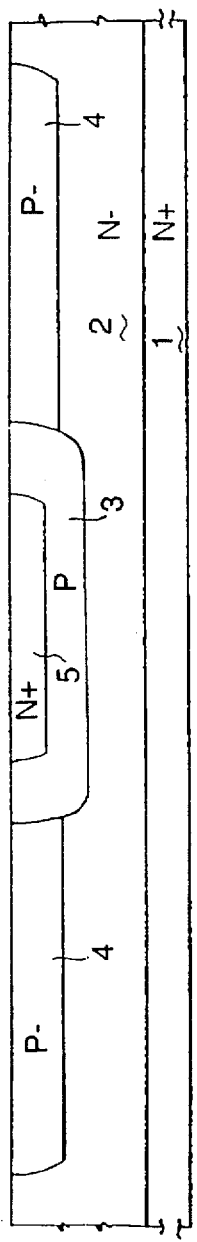
FIG. 3–5 are cross-sectional views taken at different steps of a fabrication process of the second embodiment.

FIG. 1 is a cross-sectional view of a discrete bipolar NPN power transistor. It is obtained in an N+ semiconductor substrate 1 over which a first N− epitaxial layer 2 is grown. A "P" type diffused region 3 is obtained in the first epitaxial layer 2 and is surrounded by a first buried ring formed by an annular "P−" region 4. "P−" region 4 is also obtained by diffusion into the first epitaxial layer 2. An "N+" region 5 is obtained by diffusion into the "P" type diffused region 3.

A second N− epitaxial layer 6 is grown over the first epitaxial layer 2, and an annular P+ region 7 is diffused into the second epitaxial layer 6 to contact the P type diffused region 3. A second ring is formed by an annular P− region 8, obtained by diffusion into the second epitaxial layer 6. The second ring surrounds the annular P+ region 7. An N+ region 9 is diffused into the second epitaxial layer 6 to contact the N+ region 5.

The entire surface is then covered with an insulating oxide layer 10, in which contact areas are provided to allow metal strips 11 and 12 to respectively contact the annular P+ region 7 and the N+ region 9. The bottom surface of the substrate 1 is contacted by a metal layer 13.

The N+ region 9 and the underlying N+ region 5 form In emitter region of the discrete bipolar NPN power transistor, which is connected by the metal strip 12 to an external emitter terminal E. The P type diffused region 3 forms a base region of the discrete bipolar transistor, which is connected, by the annular P+ region 7 and the metal strip 11 to an external base terminal B. The first and second epitaxial layers 2 and 6 and the semiconductor substrate 1 form a collector region of the discrete bipolar power transistor, which is connected by the metal layer 13 to an external collector terminal C.

The two rings formed by the annular P− regions 4 and 8 represent an edge structure according to the invention for the bipolar power transistor, and prevent the base-collector junction from experiencing early breakdowns, induced by the finite curvature radius, under reverse bias.

FIG. 2 is a cross-sectional view of a bipolar low voltage transistor which can be integrated with other components on the same chip. In this case, the N+ region 9 has an annular shape and delimits a portion 14 of the second epitaxial layer 6. Inside portion 14 a P− region 15 is diffused, and an N+ region 16 is then defined within region 15.

Contact areas are provided in the insulation oxide layer 10 to allow metal strips 17, 18, and 19 to respectively contact the N+ region 16, the P− region 15 and, through the N+ annular region 9, the N+ region 5.

The N+ region 16 forms an emitter region of the bipolar low voltage transistor, and the P− region 15 and the N+ region 5 form a base region and a collector region, respectively. The metal strips 17, 18, and 19 are respectively connected to external terminals E, B and C.

The P type region 3 and the P+ annular region 7 which surround the bipolar low voltage transistor form a region to isolate the transistor from the substrate 1 of the chip. To ensure the electrical isolation, these P type regions shall be negatively biased with respect to the substrate 1. Again, the annular P− regions 4 and 8 form an edge structure according to the invention, which prevents the junction between the P type region 3 and the epitaxial layer 2 from experiencing early breakdowns.

A manufacturing process suitable to obtain a device with an edge structure according to the present invention, particularly the device shown in FIG. 2, starts with the growth of the first lightly doped N+ epitaxial layer 2 over the N+ semiconductor substrate 1.

By selectively implanting and successively diffusing dopants into the first epitaxial layer 2, the P type region 3 is formed. Further implanting and diffusion defines the N+ region 5, enclosed within region 3.

A third masked implant, and a successive diffusion, allow the formation of the P− annular region 4, forming the first buried ring, around the P type region 3. This step could alternatively be performed before the formation of the N+ region 5, or before the definition of the P type region 3 (FIG. 3).

Figure 4:
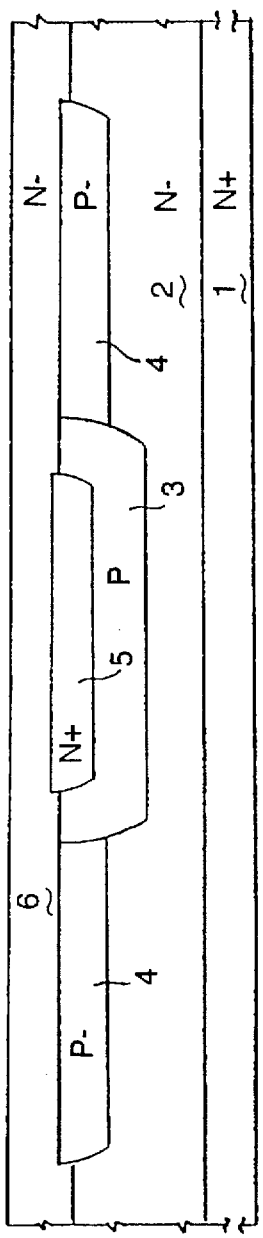

The second, lightly doped N− epitaxial layer 6 is then grown over the entire top surface of the chip (FIG. 4). The annular P+ region 7 is then diffused into the second epitaxial layer 6 to contact the P type region. 3, followed by the masked implant and diffusion of the P-annular region 8, constituting the second ring, around the annular P+ region 7. This defines the edge structure.

Each of the P-annular regions 4 and 8 could be made up by two or more merged concentric regions with dopant concentration decreasing from inner regions to outer regions, in order to further reduce the surface electric field, with techniques known in the art.

Figure 5:
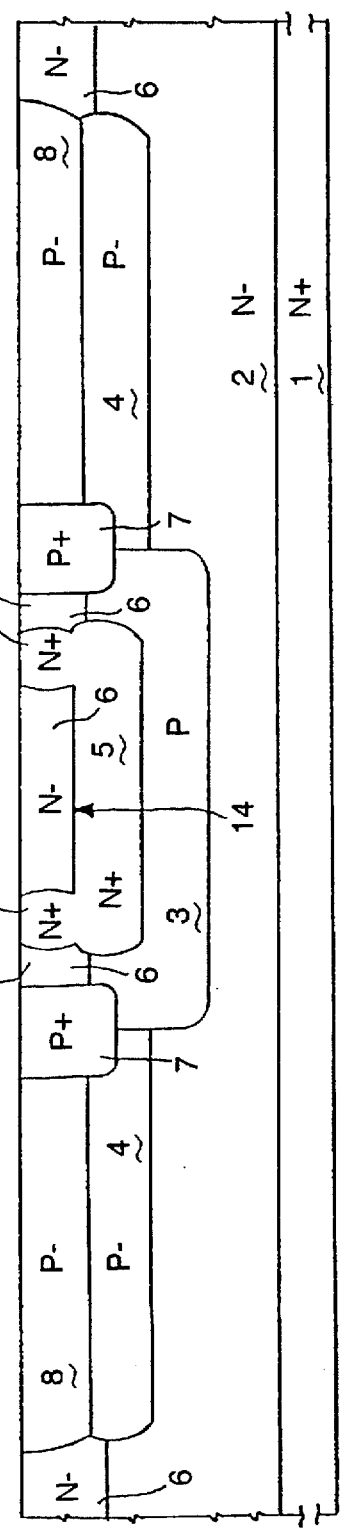

The described steps obtain partial structures of FIGS. 1 and 2. To proceed with the fabrication of the structure of FIG. 2, the N+ region 9 is formed by selectively implanting and diffusion (FIG. 5). The region 9 extends into the second epitaxial layer 6 to contact the underlying N+ region 5. In this case it has an annular shape and delimits a portion 14 of the second epitaxial layer 6 into which the P region 15, forming the base region of the bipolar low voltage transistor, is diffused. To form the emitter region, the N+ region 16 is diffused within the P region 15.

The following process steps are similar to known processes, including the oxidation of the entire surface, the definition of contact areas and the deposition of a metal conductive layer which, after being selectively removed, forms the metal strips 17, 18 and 19. The surface of the chip is eventually passivated, for example with glass, and the bottom surface of the substrate 1 is covered with a metal conductive layer 13.

Figure 6:
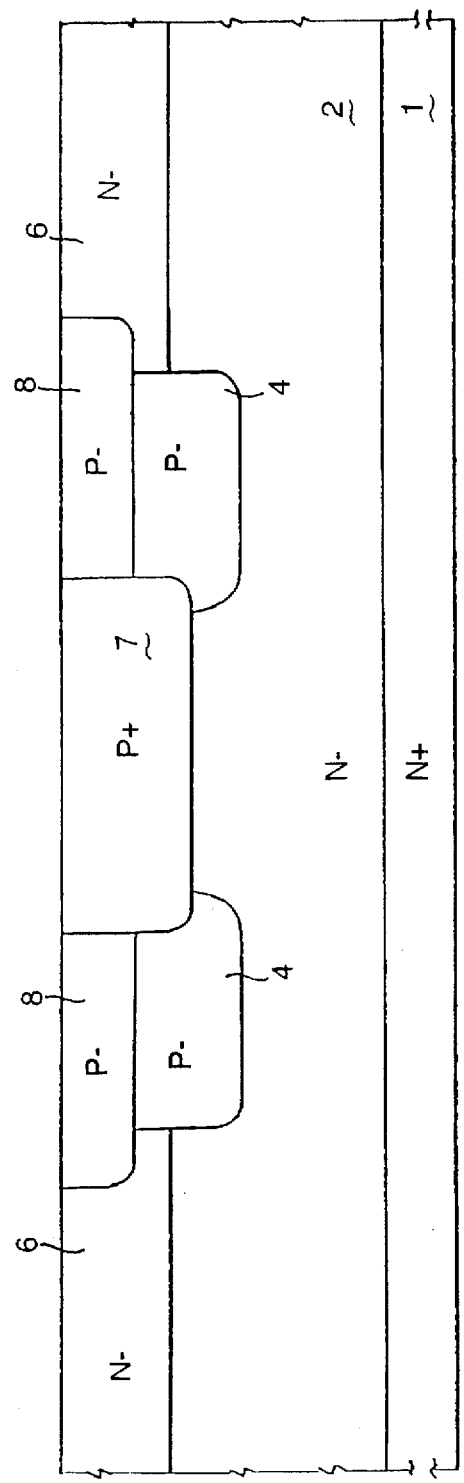
FIG. 6 and 7 are cross-sectional views of further embodiments of the invention.
Figure 7:
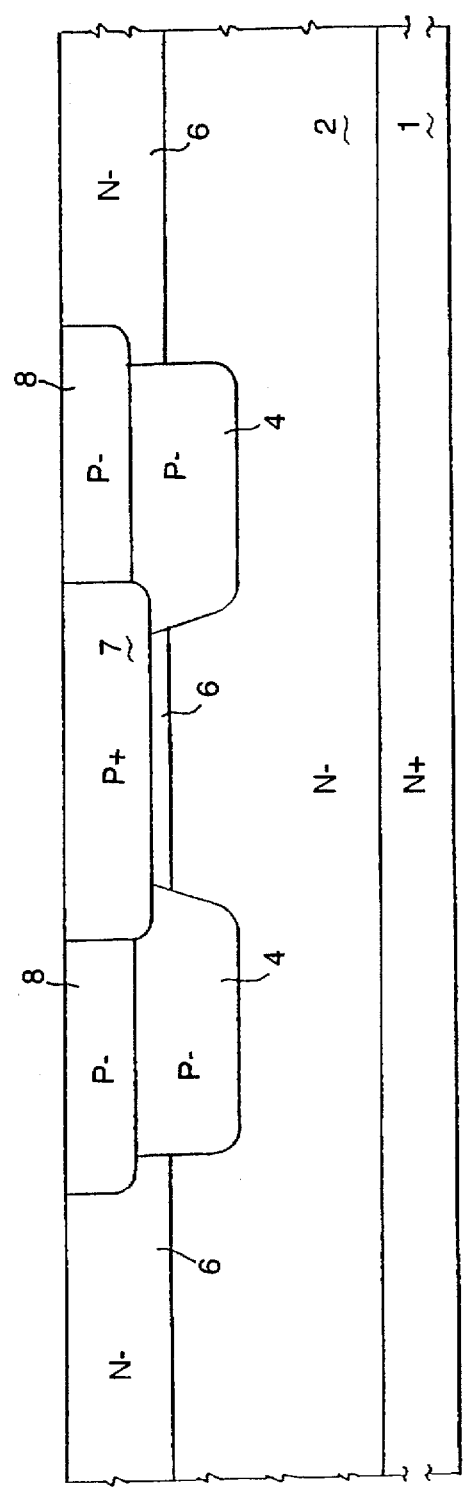

In a possible variation to the previous embodiments, and within the scope of the present invention, regions 3, 5 and 9 are omitted. The region 7 does not have an annular shape, and the metal strip 12 is not defined, so that a PN high voltage diode is formed (FIGS. 6 and 7). This only requires the omission of some process steps, such as the implantation and diffusion of dopants into the first epitaxial layers 2 to form the diffused region 3, the implantation and diffusion of region 5 and of the annular region 9. In this case the anode region 7 of the PN diode is shallower than the edge structure formed by regions 4 and 8. Alternatively, it may extend into the first epitaxial layer 2 or be within the second epitaxial layer 6. The regions 4 and 8 can have different extensions, provided that at least one portion of the region 8 is superimposed on and merged with the region 4. It is also possible to use the teachings of the present invention in processes such as those described in EP-459578 and EP-453026, with modifications well known in the art. Alternatively, it may extend to a Power MOSFET or an IGBT (Insulated Gate Bipolar Transistor). In case of processes in which three or more epitaxial layers are grown, the edge structure of the present invention is defined in the upper two of such layers.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A method for manufacturing an integrated edge structure for a high voltage monolithic semiconductor device, the method comprising the steps of:

a) growing a first lightly doped epitaxial layer of a second conductivity type over a heavily doped semiconductor substrate;

b) maskedly implanting and subsequently diffusing dopants into said first epitaxial layer to form a first lightly doped ring of a first conductivity type;

c) growing a second lightly doped epitaxial layer of the second conductivity type over said first epitaxial layer;

d) maskedly implanting subsequent diffusing dopants into said second epitaxial layer to form a diffused region of the first conductivity type said diffused region of the first conductivity type forming a first region of the PN junction, and said first and second epitaxial layers of the second conductivity type forming a second region of the PN junction; and e) maskedly implanting and subsequently diffusing dopants into said second epitaxial layer to form a second lightly doped ring of the first conductivity type comprising at least one portion superimposed over and merged with said first ring, the second lightly doped ring surrounding and being merged with the diffused region of the first conductivity type.

2. The process according to claim 1, further comprising a step of maskedly implanting and subsequent diffusing dopants into said first epitaxial layer to form a buried region of a first conductivity type, said first ring surrounding the buried region and said diffused region being superimposed on and merged with said buried region, said further step being performed between steps (a) and (b).

3. The process according to claim 1, wherein the semiconductor substrate is of the first conductivity type.

4. The process according to claim 1, wherein the semiconductor substrate is of the second conductivity type.

5. A method for manufacturing an integrated edge structure for spreading the depletion layer of a PN junction, which results from a diffused region of a first conductivity type abutting a region of a second conductivity type, the method comprising the steps of:

forming a first lightly doped ring of the first conductivity type around the diffused region; and forming a second lightly doped ring of the first conductivity type superimposed over and merged with the first ring and also surrounding and being merged with the diffused region.

* * * * *

UNITED STATES PATENT AND TRADEMARK OFFICE
CERTIFICATE OF CORRECTION

PATENT NO. : 5,895,249
DATED : April 20, 1999
INVENTOR(S): Raffaele Zambrano, Salvatore Leonardi and Giovanna Cacciola It is certified that error appears in the above-identified patent and that said Letters Patent is hereby corrected as shown below:

On the title page, item [75] should read:

[75] Inventors: Raffaele Zambrano, San Giovanni La Punta; Salvatore Leonardi, Stazzo Fraz Acireale; and Giovanna Cacciola, Messina, all of Italy Col. 1, line 38, should read
write. At the junction edges, because of the finite junction Col. 3, line 43, should read
The N+ region 9 and the underlying N+ region 5 form an Col. 4, line 21, should read
Of the first lightly doped N+ epitaxial layer 2 over the N+

Signed and Sealed this

Eleventh Day of January, 2000

Attest:

Q. TODD DICKINSON

*Attesting Officer*   *Acting Commissioner of Patents and Trademarks*